United States Patent [19]

Whitson et al.

[11] Patent Number: 5,298,045
[45] Date of Patent: Mar. 29, 1994

[54] FILTER FOR AVIONIC LINE REPLACEMENT UNIT

[75] Inventors: Frederick A. Whitson, Oconomowoc; William K. Siebert, West Bend, both of Wis.

[73] Assignee: Electronic Cable Specialists, Inc., Franklin, Wis.

[21] Appl. No.: 33,158

[22] Filed: Mar. 16, 1993

[51] Int. Cl.⁵ ............................................. B01D 46/10
[52] U.S. Cl. ..................................... 55/385.6; 55/493; 55/502; 55/518
[58] Field of Search ..................... 55/385.4, 385.6, 493, 55/502, 503, 515, 516, 518, DIG. 31

[56] References Cited

U.S. PATENT DOCUMENTS

| | | | |
|---|---|---|---|
| 2,735,964 | 2/1956 | Greve et al. | 55/385.6 X |
| 4,549,887 | 10/1985 | Ioanxou | 55/493 X |
| 4,889,542 | 12/1989 | Hayes | 55/385.6 X |

*Primary Examiner*—Charles Hart
*Attorney, Agent, or Firm*—Ryan, Kees, & Hohenfeldt

[57] ABSTRACT

A filter assembly for a line replaceable unit (LRU) uses a four-walled frame to define a plenum which mounts in sealing relationship with the top surface of an LRU. The frame interfaces with the LRU through a gasket and there is a gasket on a rim extending from the LRU walls on which the filter element is superimposed such that the filter element, the walls of the frame and the perforated top surface of the LRU define a plenum. When the frame is integral to or mounted to the avionic tray that supports the LRU, the filter element is mounted to the top of the frame and the hold-down cover compresses the filter element to the frame such that intervening gaskets effect a seal between the parts so that all air entering the LRU under the influence of negative pressure applied to holes in the bottom of the LRU must pass through the large area filter element. The cover is hinged so that it can be unlocked from the avionic tray and swung to a position wherein the filter element is accessible for being grasped, removed and replaced with a clean element without requiring withdrawal of the LRU from the avionic tray.

7 Claims, 2 Drawing Sheets

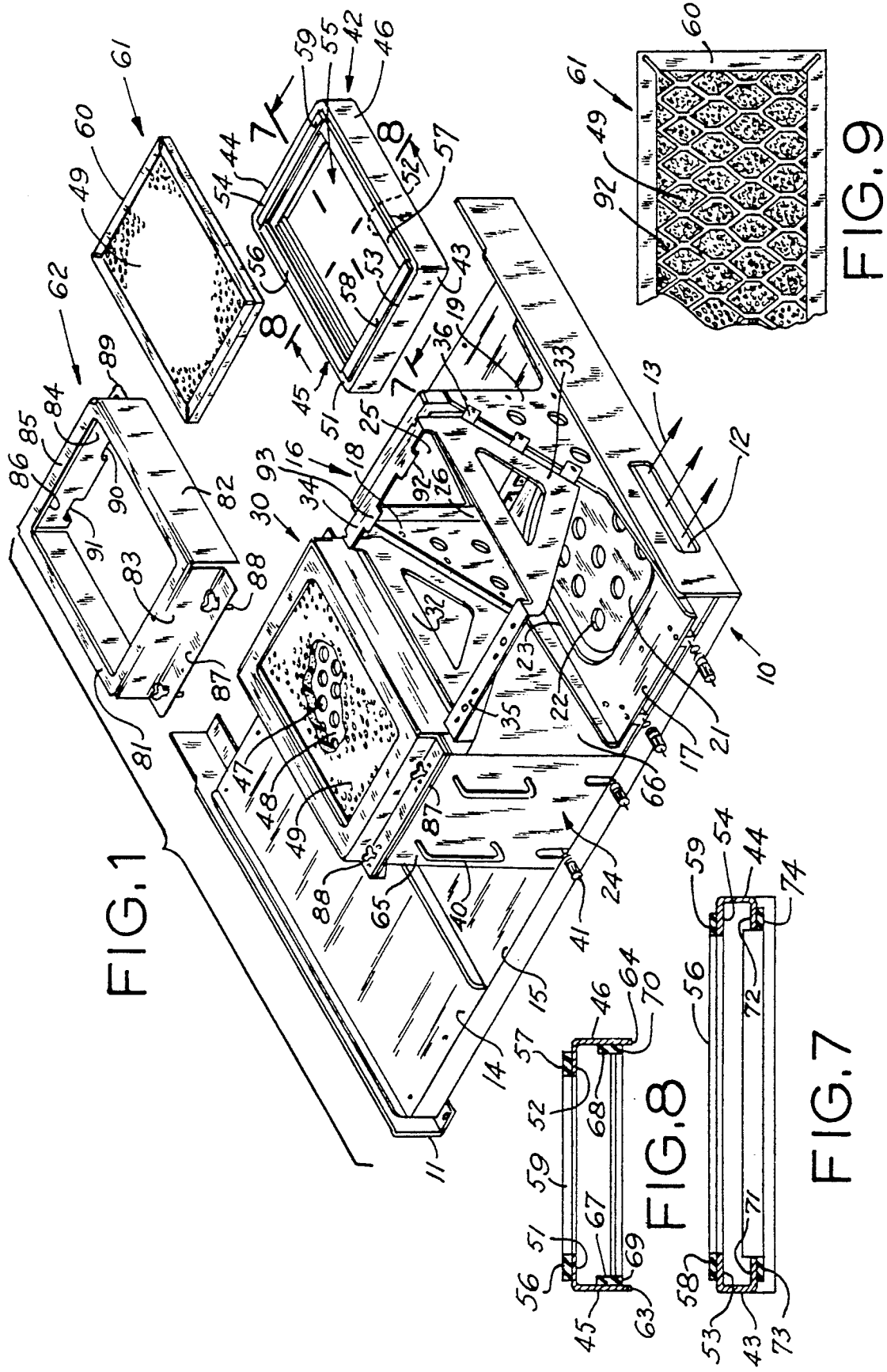

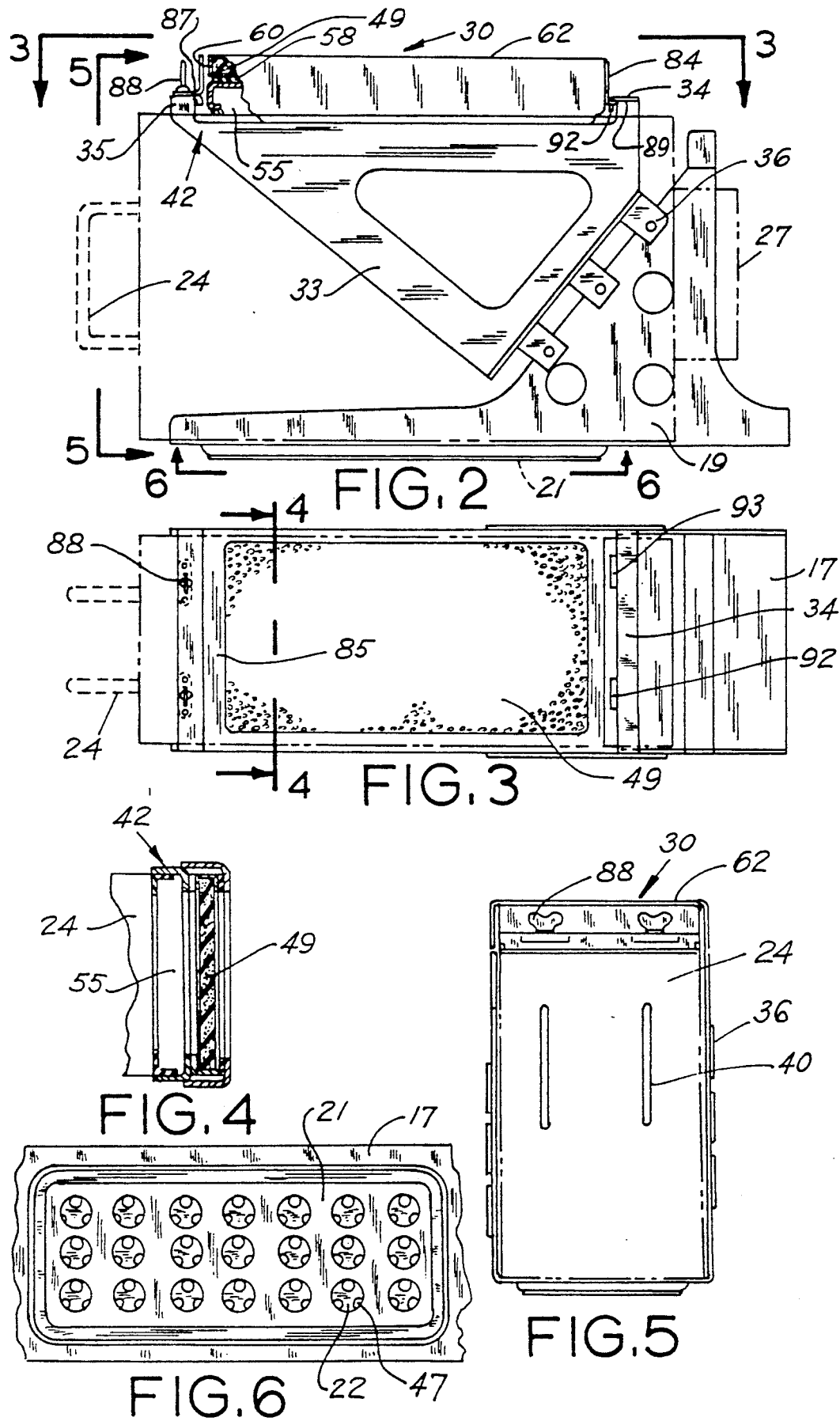

FILTER FOR AVIONIC LINE REPLACEMENT UNIT

BACKGROUND OF THE INVENTION

This invention pertains to a filter assembly for filtering coolant air that passes through an avionic line replaceable unit (LRU) box.

In aircraft, electronic and electrical circuitry is customarily retained in LRUs which are essentially boxes that have air inlet and outlet holes on their top and bottom surfaces. The LRUs are inserted in trays whose dimensions and configurations are standardized in accordance with the requirements of the avionic industry. Multiple circuit electrical connectors are typically mounted in the rear part of the tray and mating electrical connectors are mounted on the rear of the LRUs so that when the LRU is slid into the tray, the mating connectors join and a plurality of electrical circuits are completed. The bottom or base of the tray is generally planar and has a large opening, typically, for communicating the air passing into or out of the LRU with a large plenum whose interior may be at a positive pressure relative to atmospheric pressure or, in some installations, the pressure may be negative relative to atmospheric pressure. In any case, an opening in the base of the tray will have a gasket that effects a seal with the bottom of the LRU box and with the underlying plenum. Moreover, the opening in the plenum is typically subdivided into a plurality of openings which can be selectively plugged to accomplish what is called metering of the airflow through the LRU box. In dedicated designs no holes are plugged because the number of holes are selected so their total cross section provides the air flow required n a particular LRU.

In existing aircraft, the customary practice is to maintain the plenum or shelf interior at a negative pressure such that air is drawn in through the top holes of the LRU box and is drawn out through holes in the bottom of the box for being conducted away and possibly discharged to the atmosphere through a conduit in which there is a suction or pressurizing fan that maintains the desired negative pressure condition in the plenum.

The LRUs are mounted in various compartments in the aircraft such as in a compartment beneath the pilot's cabin or in a compartment located above or below the passenger cabin, either into the compartment or elsewhere. The cooling air for the LRUs is drawn into such compartment by various means, including ventilation systems, ventilation ports, doors, hatches and the like and discharged either into the compartment or elsewhere by way of the plenum or shelf air conduit. Trays may be installed in compartments which are in air circulation communication with the passenger compartment, the baggage compartment and other sub-cabin compartments wherein the air may contain various contaminants such as smoke, grease, aerosols, flies, insects, hair and other organic matter in aircraft which carry live animals, for example. These contaminants are entrained in the coolant air that is either forced through or drawn through the LRUs. The result is that electronic components in the LRUs, such as circuit boards or circuit elements, acquire a coating of contaminants which, in some cases, are conductive and in any case constitute a barrier for heat transmission. It is well known that the operating life of electronic circuits is correlated to the temperature at which they operate When dirty or contaminated air is circulated through the LRU boxes, failures of the circuitry occur prematurely, and such failure, needless to say, may jeopardize the safety of the aircraft and its passengers, as well as be very costly for the aircraft operator.

It is also important to aircraft operators that replacing an LRU involves a more demanding procedure than simply unplugging one unit and inserting a substitute unit into the avionic tray. If the connection between the multi pin plug and socket connectors on the LRU and on the avionic tray are separated, it is required in compliance with governmental and avionic maintenance industry rules to check the integrity and proper function of every one of the plurality of circuits that are made by the multiple line connectors before the replacement process can be accepted, and the aircraft can be restored to operation. It will be evident, therefore, that it would be highly desirable to have a coolant air filter assembly associated with each LRU that not only provides for filtering the input air to the LRU and assures uniform airflow through the LRU but also allows replacement of the dirty or contaminated filter itself without requiring that the LRU be disconnected, withdrawn from the avionic tray or otherwise disturbed

SUMMARY OF THE INVENTION

The new coolant air filter assembly is designed and adapted for being mounted on a modified standard avionic tray independently of the LRU but in airflow communication with the LRU such that the filter element in the assembly can be replaced without disturbing the LRU.

The new coolant air filter assembly is also distinguished by obtaining improved distribution and uniformity of the airflow over the cross-section of the LRU box interior by having an individual filter for each LRU and by virtue of the new coolant air filter assembly interfacing with the LRU box by way of a plenum that extends over a majority of the area of the perforate top surface of the LRU box.

How the foregoing general objects and other more specific objects of the invention are achieved will be evident in the ensuing more detailed description of a preferred embodiment of the invention which will now be set forth in reference to the accompanying drawings.

DESCRIPTION OF THE DRAWINGS

FIG. 1 is a perspective view of an avionic tray plenum shelf supporting one unoccupied tray, one tray containing an LRU that is provided with the new coolant air filter assembly, and an exploded view of the filter assembly;

FIG. 2 is a side elevational view of a modified standard avionic tray showing the LRU and the electrical connectors in phantom lines, and showing the new coolant air filter assembly mounted to the tray with its plenum in interfacing and sealing relationship with the top surface of the LRU;

FIG. 3 is a top plan view of the assembly as viewed in the direction of the arrows 3—3 in FIG. 2;

FIG. 4 is a partial vertical sectional view taken on a line corresponding with 4—4 in FIG. 3;

FIG. 5 is a front elevational view looking in the direction of the arrows 5—5 in FIG. 2;

FIG. 6 is a bottom view of the avionic tray depicted in FIG. 2 taken in the direction of the arrows 6—6;

FIG. 7 is a vertical section taken through the opposite end walls of the filter assembly frame looking in the direction of the arrows 7—7 in FIG. 1;

FIG. 8 is a vertical section taken through the opposite side walls of the filter assembly frame looking in the direction of the arrows 8—8 in FIG. 1; and FIG. 9 is a bottom view of the filter element which is shown in isolation from the assembly in the exploded view of FIG. 1.

DESCRIPTION OF A PREFERRED EMBODIMENT

Attention is invited to FIG. 1 which shows a box-like plenum shelf that is generally designated by the numeral 10. The plenum shelf may be mounted in an aircraft on support members such as the one marked 11. The shelf is hollow and, it is subject to having a negative pressure developed in it or, in some cases, a positive pressure. In the embodiment depicted in FIG. 1, it is assumed that the interior of the plenum shelf 10 has air at negative or below ambient pressure developed in it. The shelf has at least one end opening 12 through which air may be withdrawn to cause flow in the direction of the arrows 13. Those familiar with the art are aware of various means to create suction at opening 12 and a negative pressure in the shelf 10.

In FIG. 1, the shelf is depicted as being designed for accommodating four avionic trays. Where there are no trays, the shelf is closed off at the top such as by sealing plates 14 and 15 and the gasket material between them. At the right end of the shelf in FIG. 1, there is an avionic tray which is generally designated by the numeral 16. The tray comprises a base plate 17 that has integral upstanding triangularly-shaped sidewalls 18 and 19 in which there may/may not be included the lightener holes as shown. The bottom 17 of avionic tray 16 has a recessed plate 21 in which there are a plurality of airflow metering holes 22 as is typical. Usually, at least some of the metering holes 22 are plugged with removable rubber plugs, not shown, so that the totality of the air passage area of the holes can be adjusted to match the amount of coolant air that is required for the particular heat generating electronic components in the LRU that will be supported on the tray 16 for having coolant air drawn through it. The recessed bottom plate 21 of the tray has a gasket 23 fastened to it, this gasket may be of the type that is capable of sealing in two directions such as the gasket depicted in U.S. Pat. No. 3,871,937. As will be discussed momentarily, a line replaceable unit (LRU) such as the one designated generally by the numeral 24 has holes in its bottom such that it can make a sealed connection to the top edge of gasket 23 while the bottom edge of the gasket will effect a seal with the metering plate 21 to establish an airflow path from the holes in the bottom of the LRU to plenum shelf 10. The recessed metering plate 21, of course, is actually supported on gasket 23 as is evident in the cited patent.

As is customary, the conventional or standard avionic tray has a rear wall in which there is an opening 25 bounded by vertical rims 26. These rims are provided for mounting a plate, not shown, for supporting a stationary multiple pin connector such as the one symbolized by the phantom line rectangle 27 in FIG. 2.

The basic avionic tray 16 is modified as shown in FIG. 1 to adapt it to cooperating with the new filter assembly which is generally designated by the numeral 30 in the various figures. In FIG. 1, the addition to the basic tray is comprised of two triangularly-shaped sidewalls 32 and 33 which are joined together by laterally extending bridging members 34 and 35. Actually, sidewall members 32 and 33 and laterally extending members 34 and 35 are all formed as a single metal stamping composed of a lightweight metal such as an aluminum alloy. The adapter, comprised of members 32-35, is mounted to the sidewalls 18 and 19 of the basic standard avionic tray by means of tabs such as the one marked 36. These tabs may be joined to the sidewalls by means of flush rivets or spot welding, for example, or the entire assembly may be fabricated from a single formed metal stamping.

One of the avionic trays in FIG. 1 has an LRU box 24 mounted in it. The box can be pushed into the avionic tray by means of a pair of handles and the box can be withdrawn from the tray by handles such as the one marked 40. Locking members 41 secure the LRU 24 in the avionic tray and assure that the electrical connection at the rear of the box as viewed in FIG. 1 will be held secure under all conditions.

FIG. 6 is a view of the bottom of typical avionic tray 16 in FIG. 2. FIG. 6 exhibits the metering plate 21 and the airflow metering holes 22 which were previously mentioned in connection with FIG. 1. Assuming all of the previously mentioned rubber plugs are removed from the metering plate 22, one will see by viewing FIG. 6 that the bottom of the LRU box 24 is provided with a myriad of small holes 41 through which coolant air is drawn out of the LRU by the negative air within shelf plenum 10.

In FIG. 1, the new coolant air filter assembly 30 is mounted on LRU 24. The four major components of the filter assembly, that is, the frame 42, filter element 61, hold-down cover 62 and sidewall adapter 32-35 are also shown in exploded perspective fashion adjacent the illustrative plenum shelf 15 in FIG. 1 Considering the frame 42 separate from the filter assembly 30 in FIG. 1, one may see that the frame 42 is a unitary member comprised of end walls 43 and 44 and sidewalls 45 and 46. Flat rims 51 and 52 extend inwardly of the top edge of sidewalls 45 and 46, respectively, of frame member 42. The rim portions 51 and 52 are also visible in FIG. 8. The end walls 43 and 44 of frame 42 also have flat rim portions 53 and 54 extending inwardly of the central opening 55 defined by the sidewalls 43-46 of the frame. The sidewall rims 51 and 52, as can be seen best in FIG. 8, have gasket portions 56 and 57 adhered to them. The end wall rims 53 and 54 have gasket portions 58 and 59 adhered to them. Thus, it will be evident that the rim portions of frame 42 and gasket portions 56-59 are all coplanar on the rim and actually are in one piece. As is evident in the upper right region of FIG. 1, the marginal frame 60 of the filter element 61 interfaces or lies flatly on coplanar gasket portions 56-59 on top of the frame.

In FIG. 8, it will be evident that the sidewalls 45 and 46 have downwardly projecting lower edges 63 and 64. The distance between these edges is only a small amount greater than the distance between the sidewalls 65 and 66 of LRU box 24 in FIG. 1 so the depending lower edges 63 and 64 stabilize the filter sideways of the LRU when the frame 42 is deposited on the top of the LRU.

There are a pair of edgewise upstanding gaskets 67 and 68 extending the length of the sidewalls 45 and 46 of frame 42 as is evident in FIG. 8. The lower edges 69 and 70 interface with the side margins of the flat top surface 48 of LRU 24. As shown in FIG. 7, the end walls 43 and 44 of frame 42 have inwardly extending rims 71 and 72 on which there are flat gasket portions 73 and 74. The bottom faces of gasket portions 73 and 74 are coplanar with the bottom edges 69 and 70 of gasket portions 67 and 68 so that the gasket portions 67, 68 and 73, 74 effect an airtight seal between frame 42 and the margins of the top surface 48 of LRU 24.

The second major component of the new coolant air filter assembly is the air filter element that is designated generally by the numeral 61. Filter 61 is comprised of a frame 60 which has a channel-shape cross-section for retaining a pad of porous filter medium 49 by its edges. The filter medium may be an open cell foamed synthetic resin about 5 mm thick or a reticulated foam synthetic about 5 mm thick, by way of example and not limitation. FIG. 9 reveals that filter medium 49 is prevented from distending under air velocity pressure by backing the material with a wire grid 92.

The third major component of the new filter assembly 30, namely, hold-down cover 62 will be described next. In FIG. 1, the cover 62 has sidewalls 81 and 82 and end walls 83 and 84 integrally connected. A rim 85 extends around the perimeter of the cover and there is a gasket 86 adhered to the bottom of the rim all the way around the perimeter. This gasket interfaces with the frame 60 of the filter element 61 when the cover is assembled to the frame 42 of the filter assembly. A flange or lip 87 bends outwardly from front end wall 83 of the cover. A number of cover locking pins, usually one or two, such as the one marked 88 extend down through flange 87. A flange 89 extends from the rear wall 84 of the hold-down cover. This rearwardly extending flange 89 has a number of slots such as slots 90 and 91 pierced in it and, as can be seen in FIG. 1, the slots extend into wall 84. On the cross-member 34 of illustrative modified avionic tray 16 there are two downwardly extending tongues formed which are numbered 92 and 93. In FIG. 2 one may see that a typical one of the tongues 92 extends through a slot 90 on flange 89 extending from cover end wall 84. The other tongue 93 which is not visible in FIG. 2 extends through a similar slot 91 in flange 89. The pair of tongues 92 and 93 extending through slots 90 and 91 in flange 89 constitute a hinge that permits the hold-down cover 62 to be swung on the hinge to provide access to the filter element 61 for replacing it without removing the LRU 24 from the avionic tray.

In FIG. 2, the filter assembly 30 is mounted on the top surface of LRU 24 which is symbolized by a dashed line rectangle in that figure. The thumb screw locking devices 88 are holding the hold-down cover 62 against laterally extending or bridging member 35 of the avionic tray. The negative pressure developed in the shelf plenum 10 (not shown in FIG. 2) draws air into the LRU 24 through the porous filter element 49.

An important feature of the new filter assembly is that it provides a plenum space 55 which is defined by the four walls 43-46 of the frame 42, the bottom of filter element 49 and the top surface of LRU 24 which has the myriad of small air inlet holes 47. The plenum 55 causes the intake air pressure and flow streams of the air entering the LRU to be equalized over the top surface of the LRU. Thus, the plenum provides for, in a sense, applying an equal air pressure over the entire top surface of the LRU. Preferential airflow channeling is minimized in the LRU so it becomes more unlikely that some regions might get most of the airflow at the expense of other regions.

Another important feature of the new filter assembly is exhibited in FIG. 3 where it is evident that the design provides for utilizing the entire area of the porous filter material 49 and for using all of the holes in the top of the LRU for air inlet purposes.

FIG. 5 shows a front elevational view of the LRU 24 installed in the avionic tray with the hold-down cover 62 of the filter assembly 30 latched down with typical thumb screw 88. Release of the screw by imparting a partial turn frees the cover for pivoting on the hinge formed at the rear end of the cover as previously described but the filter element 61 remains in place on the frame 42 when the cover is opened. This exposes the filter element for being grasped for removal followed by replacement of a clean element.

FIG. 4 is a section through the filter assembly when it is mounted above and sealed by way of gaskets to the LRU 24. Note how the gaskets on the frame 42 effect the seal with a top surface of the LRU 24. Note in this figure that the width of the plenum 55 is substantially as great as the width of the perforated top of the LRU. Note also that the filter element medium 49 is about as wide as possible so that no solid parts stand in the way of a clear inflow path through the filter to the LRU 24. That the width of the plenum 55 is maximized in accordance with the invention is also demonstrated in FIG. 4.

Although an embodiment of the invention has been described in detail, such description is intended to be illustrative rather than limiting, for the invention may be variously embodied and is to be limited only by interpretation of the claims which follow.

We claim:

1. A filter assembly for prefiltering coolant air that enters an avionic line replaceable unit (LRU) box through holes in the top surface of the box and exits through at least one hole in the bottom of the box which is coupled in airflow communication with a negative pressure plenum when said LRU box is in an avionic tray, said avionic tray providing support members arranged, respectively, proximate to opposite ends of said top surface of the box, said filter assembly comprising:

a frame comprised of side and end wall members that have upper and lower rims, said wall members arranged to define a plenum opening for passage of coolant air into the LRU and the frame is adapted for being positioned with the wall members superimposed on the margins of said top surface of the LRU box with sealing means between said frame and the top surface, a filter element supported in said frame for spanning across said opening at a distance from the LRU box top surface such that the filter element, the top surface and the walls of the frame define a plenum under the filter element, a hold-down cover for being superimposed in compressive relation on said filter element and having an open area for filtered air to flow into the plenum, and means for releasably attaching said hold-down cover to said support members provided by the tray such that when said hold-down cover is released said filter element is accessible without removing said LRU box from said avionic tray.

2. The filter assembly according to claim 1 including:

means for swingably connecting said hold-down cover to one of said support members and latch means for releasably latching said hold-down cover to the other of said support members, to provide for accessing said filter element without removing said LRU by unlatching and swinging said cover.

3. The filter assembly according to claim 1 wherein:
said hold-down cover is comprised of walls including opposite front and rear walls and opposite side walls for depending along the walls of the frame and having a top side comprised of rims projecting inwardly of the walls to define the margins of said open area of the cover, a selected one of either said rear wall of the cover or said support member proximate to the end of the top of the LRU having a slot and the other of the rear wall of the cover or the support member not having said slot having a tongue projecting into said slot to effect a hinge connection between the cover and said support member to provide for accessing said filter element without the need for removing the LRU from the tray by swinging said cover on said hinge connection, and means for releasably latching said cover at its front wall to the other support member.

4. The device according to any one of claims 1, 2 or 3 wherein said avionic tray structure includes a generally planar base plate having an airflow opening, an upstanding rear wall plate for mounting an electrical connector and sidewall plates for projecting upwardly from opposite side edges of said base plate, said structure comprising a conventional avionic tray, and an additional structure comprising:

an extension side plate member extending upwardly from each sidewall plate of said standard tray, said support members that are arranged proximate to said ends of the top surface of the LRU box spanning across the space between said extension side plate members and said support members are connected at opposite ends to said extension side plate members.

5. An air filter assembly for an avionic line replaceable unit (LRU) box adapted for containing electrical devices, the box top having a flat nominally rectangular configuration containing upstream cooling air inlet means, the box bottom containing downstream air outlet means for being disposed in airflow communication with a chamber having negative pressure, the box being configured to be installed in an avionic tray that has fixed laterally extending longitudinally spaced apart support members for the filter assembly at a height about equal to the height of the box, a plenum frame having opposite laterally extending end walls and opposite longitudinally extending sidewalls formed as a rectangle for being superimposed on the laterally and longitudinally extending margins, respectively, of the LRU top surface, a sealing gasket interposed between the plenum frame and the LRU top surface, support surfaces on the plenum frame, a filter element supported from said support surfaces and a sealing gasket interposed between the margins of the filter element and the support surfaces, said filter element being supported in the plenum frame at a distance from the box top for defining a plenum over the box top in conjunction with the walls of the frame and the LRU top surface, a hold-down member for bearing on said margins of the filter element and means for engaging the hold-down member with said laterally extending support members such that the hold-down member exerts a compressive force on the filter element and on said sealing gasket.

6. The device according to claim 5 wherein said hold-down member has opposite laterally extending end wall members and opposite longitudinally extending sidewall members arranged as a rectangle defining an opening, and a rim extending inwardly of the opening from the front, rear and sidewall members for bearing on the margins of said filter element, said means for engaging said hold-down member comprises hinge means connecting an end wall of the hold-down member to one of said laterally extending support members of the avionic tray, and locking means for locking and alternately unlocking the hold-down member to the other laterally extending support member of the avionic tray, such that when the hold-down member is unlocked it can be swung on the hinge means to allow access to the filter element for removing it without being required to remove the box from the tray.

7. The filter assembly according to claim 5 wherein said hold-down member has at least one slot and a support member has a tongue registered in the slot to serve as a hinge for the hold-down member and provide for swinging the hold-down member for accessing the filter element without moving the LRU in the tray.

* * * * *

UNITED STATES PATENT AND TRADEMARK OFFICE
CERTIFICATE OF CORRECTION

PATENT NO. : 5,298,045
DATED : March 29, 1994
INVENTOR(S) : Frederick A. Whitson et al.

It is certified that error appears in the above-indentified patent and that said Letters Patent is hereby corrected as shown below:

Column 1, Lines 47/48:
After "cabin" insert a period (.) and delete "either into the compartment or elsewhere".

Signed and Sealed this

Fourth Day of October, 1994

Attest:

BRUCE LEHMAN

*Attesting Officer*    *Commissioner of Patents and Trademarks*